US012762315B2

(12) United States Patent
Verma et al.

(10) Patent No.: US 12,762,315 B2
(45) Date of Patent: Oct. 13, 2026

(54) IDENTIFYING POTENTIAL IMPROVEMENT OPPORTUNITIES FOR SIMULATION PERFORMANCE OF AN INTEGRATED CIRCUIT DESIGN

(71) Applicant: Synopsys, Inc., Mountain View, CA (US)

(72) Inventors: Gaurav Kumar Verma, Fremont, CA (US); Krishna Menon Mathilakath, Portland, OR (US); Mayank Gupta, Cupertino, CA (US); Vivek Gaur, Marlborough, MA (US)

(73) Assignee: Synopsys, Inc., Sunnyvale, CA (US)

( * ) Notice: Subject to any disclaimer, the term of this patent is extended or adjusted under 35 U.S.C. 154(b) by 1306 days.

(21) Appl. No.: 17/457,187

(22) Filed: Dec. 1, 2021

(65) Prior Publication Data

US 2022/0180033 A1 Jun. 9, 2022

Related U.S. Application Data

(60) Provisional application No. 63/121,590, filed on Dec. 4, 2020.

(51) Int. Cl.

| | |
|---|---|
| ***G06F 30/39*** | (2020.01) |
| ***G06F 30/323*** | (2020.01) |
| ***G06F 30/3308*** | (2020.01) |
| *G06F 16/532* | (2019.01) |
| *G06F 30/30* | (2020.01) |

(52) U.S. Cl.

CPC ........ *G06F 30/3308* (2020.01); *G06F 30/323* (2020.01); *G06F 30/39* (2020.01); *G06F 16/532* (2019.01); *G06F 30/30* (2020.01)

(58) Field of Classification Search

CPC .... G06F 30/3308; G06F 30/323; G06F 30/39; G06F 30/30

See application file for complete search history.

(56) References Cited

U.S. PATENT DOCUMENTS

| | | | | |
|---|---|---|---|---|
| 6,128,757 A * | 10/2000 | Yousuf | G01R 31/30 | 714/724 |
| 9,449,127 B1 * | 9/2016 | Mishra | G06F 30/3312 | |
| 2003/0023941 A1 * | 1/2003 | Wang | G01R 31/318594 | 716/103 |
| 2005/0038640 A1 * | 2/2005 | David | G01R 31/31853 | 703/16 |
| 2012/0017188 A1 * | 1/2012 | Lepak | G06F 30/33 | 716/109 |
| 2013/0174108 A1 * | 7/2013 | Boehm | G06F 30/33 | 716/106 |
| 2014/0181768 A1 * | 6/2014 | Yang | G06F 30/398 | 716/107 |

* cited by examiner

*Primary Examiner* — Kamini S Shah

(74) *Attorney, Agent, or Firm* — Patterson + Sheridan, LLP

(57) ABSTRACT

Techniques for improved analysis and simulation of an IC design are disclosed. Simulation activity for an integrated circuit (IC) design is identified using one or more processors. One or more potential improvements to a simulation of the IC design are generated based on the simulation activity, the one or more potential improvements relating to at least one of signal activity or process activity, during simulation, reflected in the simulation activity. A hardware description language (HDL) design file corresponding to the IC design is modified to indicate the one or more potential improvements to the simulation.

20 Claims, 8 Drawing Sheets

IDENTIFYING POTENTIAL IMPROVEMENT OPPORTUNITIES FOR SIMULATION PERFORMANCE OF AN INTEGRATED CIRCUIT DESIGN

CROSS-REFERENCE TO RELATED APPLICATION

This application claims priority to and the benefit of U.S. Provisional Patent Application No. 63/121,590, filed on Dec. 4, 2020, which is incorporated by reference in its entirety.

TECHNICAL FIELD

The present disclosure generally relates to integrated circuit (IC) design, and more specifically, to improved analysis and simulation of an IC design.

BACKGROUND

Simulating an IC design is an important part of the design process, especially as designs grow more and more complex. Simulation performance can be measured by the time it takes for the simulator to complete simulation of a design, and can be an important factor in improving and verifying a design. For example, good performance in simulating IC designs reduces turn-around-time for design iterations, and allows designers to improve designs. However, analyzing a design to identify simulation performance bottlenecks and opportunities for improvement is a time-consuming manual process. It can require a senior engineer with special skills to analyze the design and discover opportunities that could lead to simulation performance gains.

SUMMARY

Embodiments include a method. The method includes identifying, by one or more processors, simulation activity for an integrated circuit (IC) design. The method further includes generating, by the one or more processors, one or more potential improvements to a simulation of the IC design based on the simulation activity, the one or more potential improvements relating to at least one of signal activity or process activity, during simulation, reflected in the simulation activity. The method further includes modifying, by the one or more processors, a hardware description language (HDL) design file corresponding to the IC design to indicate the one or more potential improvements to the simulation.

Embodiments further include a non-transitory computer-readable medium containing program code that, when executed by one or more processors, causes the one or more processors to perform operations. The operations include identifying simulation activity for an integrated circuit (IC) design, including: retrieving a design record relating to the simulation activity from an electronic database. The design record is generated based on a plurality of reports generated during a simulation of the IC design. Operations further include generating one or more potential improvements to the simulation of the IC design based on the simulation activity, the one or more potential improvements relating to activity reflected in the simulation activity. Operations further include modifying a design file corresponding to the IC design to indicate the one or more potential improvements.

Embodiments further include a system, including a processor and a memory having instructions stored thereon which, when executed on the processor, performs operations. The operations include identifying simulation activity for an integrated circuit (IC) design. The operations further include generating one or more potential improvements to a simulation of the IC design based on the simulation activity, the one or more potential improvements relating to a first activity reflected in the simulation activity. This includes identifying the first activity as at least one of a signal activity or a process activity in the simulation activity, and comparing the first activity to a threshold, and in response generating a first potential improvement, of the one or more potential improvements, relating to modifying the first activity during simulation. The operations further include modifying a file relating to the IC design based on the one or more potential improvements.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

DETAILED DESCRIPTION

Figure 1:
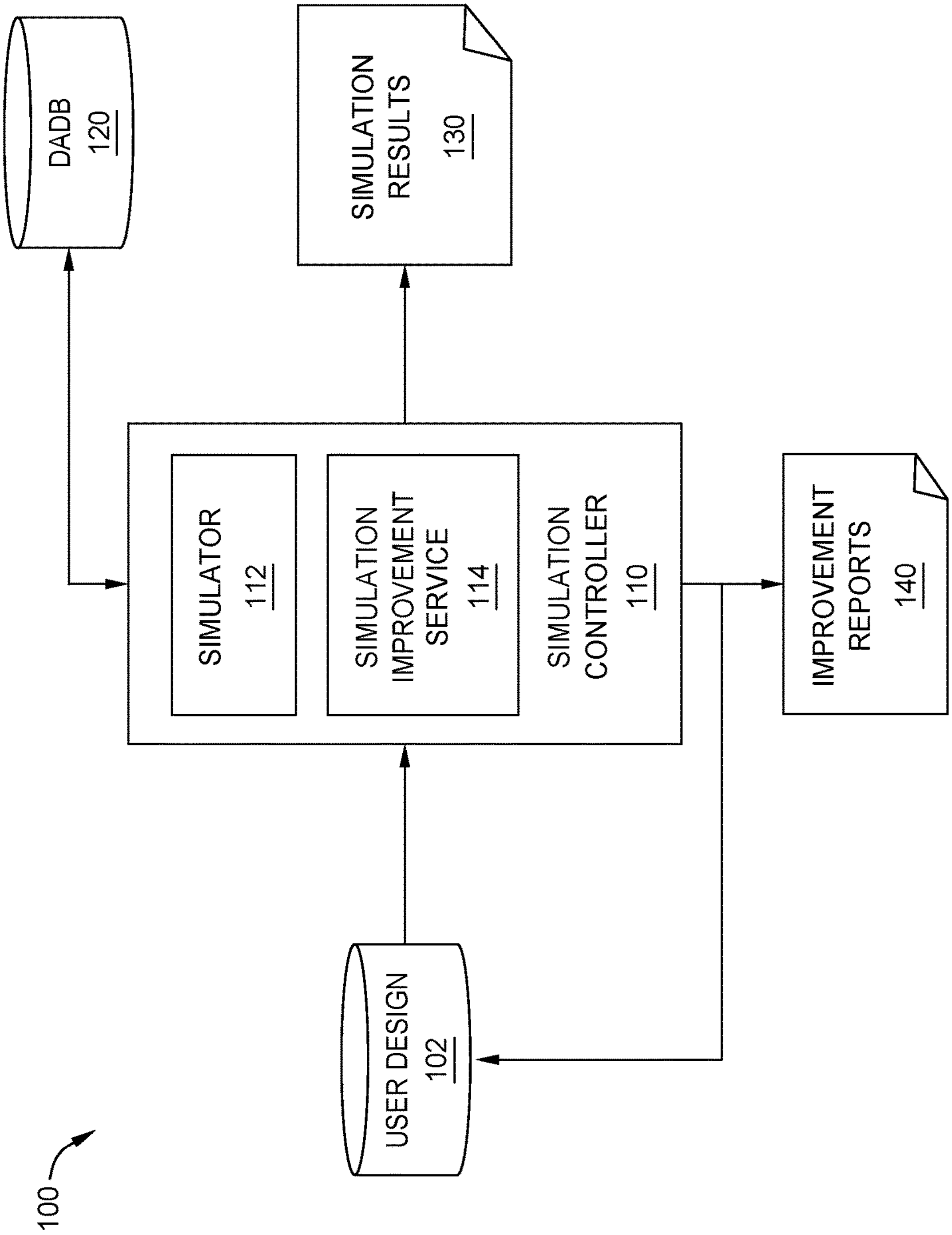
FIG. 1 illustrates identifying and implementing potential optimization opportunities (POPTs), for simulation, in an IC design, according to one embodiment.

One or more embodiments disclosed herein relate to an innovative solution to automate the process of finding, and resolving, simulation performance bottlenecks and potential improvements (e.g., POPTs) in an IC design (e.g., a design described using a suitable hardware description language (HDL)). In an embodiment, reports are generated at various stages during simulation, using a simulator, a compiler, or another suitable tool. For example, a user can establish buckets (e.g., buckets of signal or process activities) in the simulator, and can place hooks (e.g., data gathering points) to gather information about operation of the design during simulation.

In an embodiment, the reports generated during simulation can then be parsed, and the collected data can be used to identify potential improvements (e.g., POPTs) for the IC design. For example, the collected data can be used to populate an electronic Design Activity Database (DADB), or another suitable repository. The populated DADB can be analyzed to automatically identify POPTs in the design. These identified POPTs can then be used to improve simulation performance for the design.

In an embodiment, potential improvements (e.g., POPTs) can be identified using an understanding of optimizations undertaken inside a simulator. For example, POPTs may correspond to, but are not limited to, scenarios where a signal should have been identified as a particular type of signal by a compiler (e.g., an HDL compiler). A given signal may correspond to a clock signal, but a compiler (or simulator) might fail to identify the signal as a clock signal based on the signal's activity. A POPT may correspond to the failure to identify a clock signal, or another suitable type of signal.

Further, potential improvements (e.g., POPTs) may correspond to transformations or optimizations that should have kicked-in (e.g., during simulation) on a design region based on its activity, or situations where an optimization or transformation is incorrectly getting kicked-in on a design region leading to performance degradation. POPTs may also highlight scenarios of potential interest to users (e.g., for further analysis) based on activities in the design which may benefit from a new optimization or transformation. These are merely examples.

In an embodiment, potential improvements (e.g., POPTs) can be resolved (e.g., the improvement can be applied to the design) in numerous ways. For example, the IC design itself can be annotated. An HDL file describing a design could, for example, have comments added at selected locations to assist users in understanding and acting upon the specified POPTs. A new view for the IC design can be created, or an existing view can be modified, to show potential changes to the design to implement identified POPTs. In an embodiment a view of an IC design presents the design to the user in a specified manner, without modifying the behavior or functionality of the underlying design (e.g., the user view of the design changes but the behavior or functionality of the underlying design does not). Further, reports or other files detailing the POPTs can be generated, and provided to users (e.g., in a suitable electronic format) to assist users in implementing the POPTs.

One or more of these techniques can significantly improve productivity and facilitate faster turn-around-time for improving simulation performance of IC designs. For example, performance of the simulation itself can be improved, reducing the computing resources that must be allocated to the simulator and freeing resources for other uses. As another example, improved simulation performance can allow a user (e.g., an engineer) to perform more simulations, in less time and using less compute power, allowing the user to more quickly and efficiently identify any errors or performance improvement opportunities for the design. This can reduce the possibility of missed performance improvement opportunities for the IC design, and can facilitate deeper analysis that is extremely difficult to do manually, thereby improving IC design even more.

Further, one or more techniques disclosed herein can be used to solve additional problems relating to IC design. For example, techniques disclosed herein can be used to verify that improvements retain language semantics, estimate performance benefits of a potential design optimization, suggest best optimizations for a design from a family of known techniques, and provide feedback to synthesis tools to produce a more optimized, faster simulating netlist. These are merely examples. Other suitable problems can also be addressed using the techniques disclosed herein.

FIG. 1 illustrates an environment 100 for identifying and implementing POPTs, for simulation, in an IC design, according to one embodiment. A simulation controller 110 includes a simulator 112 to simulate a user design 102. In an embodiment, the user design 102 is an IC design described using a suitable HDL (e.g., Verilog, VHSIC Hardware Description Language (VHDL), or any other suitable HDL).

As described further below in relation to FIGS. 3-4, the simulator 112 simulates operation of the IC described by the design and generates simulation results 130. In an embodiment, the simulation results 130 can be used by a suitable user (e.g., a design engineer, a test engineer, or any other suitable user) to analyze the operation and performance of the IC described by the user design 102. For example, as described below in relation to FIG. 7, the simulation results 130 generated by the simulator 112 can be used during verification of the user design 102 (e.g., as part of functional verification at block 716).

In an embodiment, the simulation controller 110 can further include a simulation improvement service 114. As described further below in relation to FIGS. 3-5, the simulation improvement service 114 can facilitate identifying, and resolving, potential improvements (e.g., POPTs) in the user design 102. For example, the simulation improvement service 114 can populate a DADB 120 based on activities identified during simulation. This is described further below in relation to FIG. 4, below. In an embodiment, the DADB 120 can be any suitable electronic database (e.g., a relational database, a graph database, or any other suitable form of electronic database) or any other suitable type of repository. For example, the DADB 120 can be a cloud storage location, an on-site storage location (e.g., co-located with one or more components of the simulation controller 110), or any other suitable repository.

The simulation improvement service 114 can use the data populated in the DADB 120 to identify POPTs, and to resolve POPTs. This is described further below in relation to FIG. 5. For example, the simulation improvement service 114 can modify the user design 102 (e.g., modify the HDL file, or files, describing the IC design) to resolve POPTs. This can include adding comments to an HDL file for the IC design at specific locations, to encourage a user to modify the IC design to improve simulation performance by improving the identified POPTs. Alternatively, or in addition, the simulation improvement service can generate, or modify, a view of the user design 102 to resolve the identified POPTs. This can include presenting proposed modifications to the user design 102 (e.g., modifications to the HDL), which the user can apply to resolve the identified POPTs. The simulation improvement service 114 can further modify the user design 102 directly (e.g., modify the HDL). For example, the simulation improvement service 114 can save a backup copy of any HDL files, to allow a user to revert or undo changes, and can modify the HDL file(s) directly.

The simulation improvement service 114 can further resolve the POPTs by generating improvement reports 140. For example, the simulation improvement service 114 can generate reports identifying POPTs and associated activities for the user design 102. A user (e.g., an engineer) can then use the improvement reports 140 to modify the user design 102, the simulator 112, or both, to resolve the identified POPTs. For example, the improvement reports can identify settings or characteristics of the simulator 112 and the user design 102 that could improve simulation performance for the user design 102.

Figure 2:
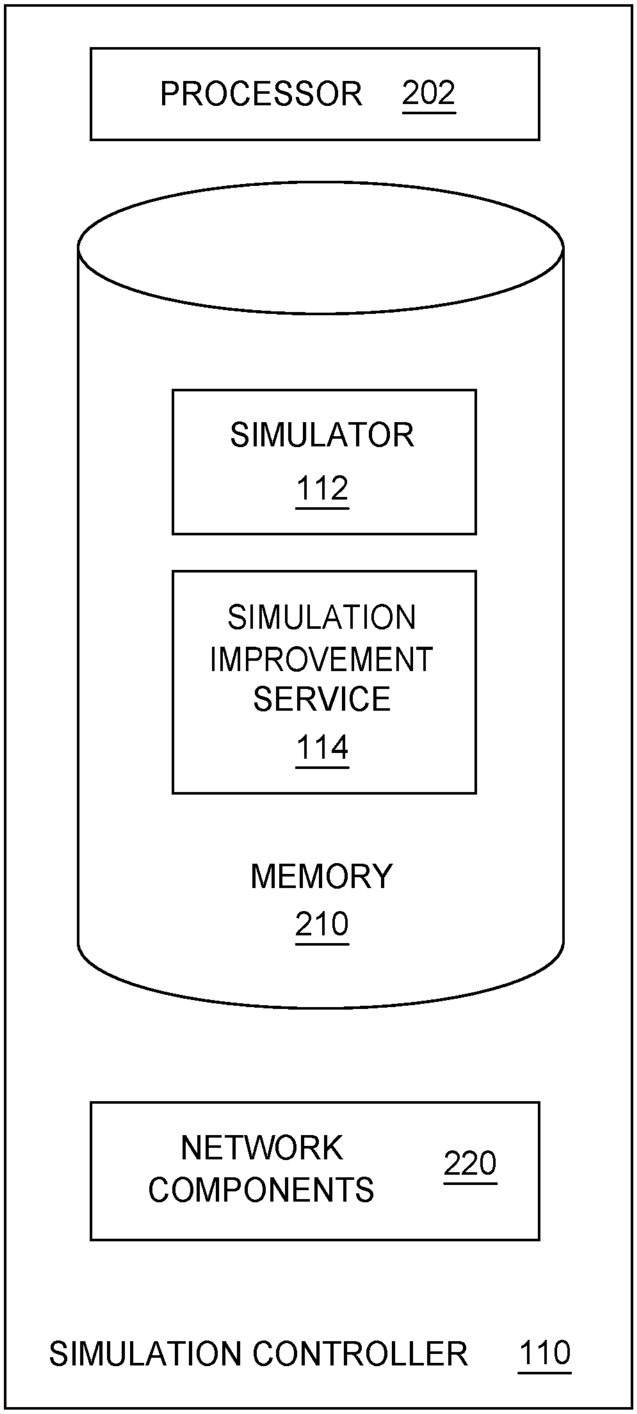
FIG. 2 is a block diagram illustrating a simulation controller for identifying and implementing POPTs in an IC design, according at an embodiment.

FIG. 2 is a block diagram illustrating a simulation controller 110 for identifying and implementing POPTs in an IC design, according at an embodiment. The simulation controller 110 includes a processor 202, a memory 210, and network components 220. The memory 210 may take the form of any non-transitory computer-readable medium. The processor 202 generally retrieves and executes programming instructions stored in the memory 210. The processor 202 is representative of a single central processing unit (CPU), multiple CPUs, a single CPU having multiple processing cores, graphics processing units (GPUs) having multiple execution paths, and the like.

The network components 220 include the components necessary for the simulation controller 110 to interface with a suitable communication network (e.g., a communication network interconnecting various components of the environment 100 illustrated in FIG. 1, or interconnecting the environment 100 with other computing systems). For example, the network components 220 can include wired, WiFi, or cellular network interface components and associated software. Although the memory 210 is shown as a single entity, the memory 210 may include one or more memory devices having blocks of memory associated with physical addresses, such as random access memory (RAM), read only memory (ROM), flash memory, or other types of volatile and/or non-volatile memory.

The memory 210 generally includes program code for performing various functions related to use of the controller 110. The program code is generally described as various functional "applications" or "modules" within the memory 210, although alternate implementations may have different functions and/or combinations of functions. Within the memory 210, the simulator 112 facilitates simulating a user IC design (e.g., the user design 102 illustrated in FIG. 1). This can be done, for example, as part of a verification process for the design (e.g., functional verification). The simulation improvement service 114 facilitates identifying, and resolving, potential improvements (e.g., POPTs) for the user IC design. This is discussed further below with regard to FIGS. 3-5, below.

While the simulation controller 110 is illustrated as a single entity, in an embodiment, the various components can be implemented using any suitable combination of physical compute systems, cloud compute nodes and storage locations, or any other suitable implementation. For example, the simulator 112 and the simulation improvement service 114 can operate on the same compute system or node, or across multiple compute systems or nodes (e.g., using a server or cluster of servers). As another example, the simulation controller 110 can be implemented using a combination of compute nodes and storage locations in a suitable cloud environment.

Figure 3:
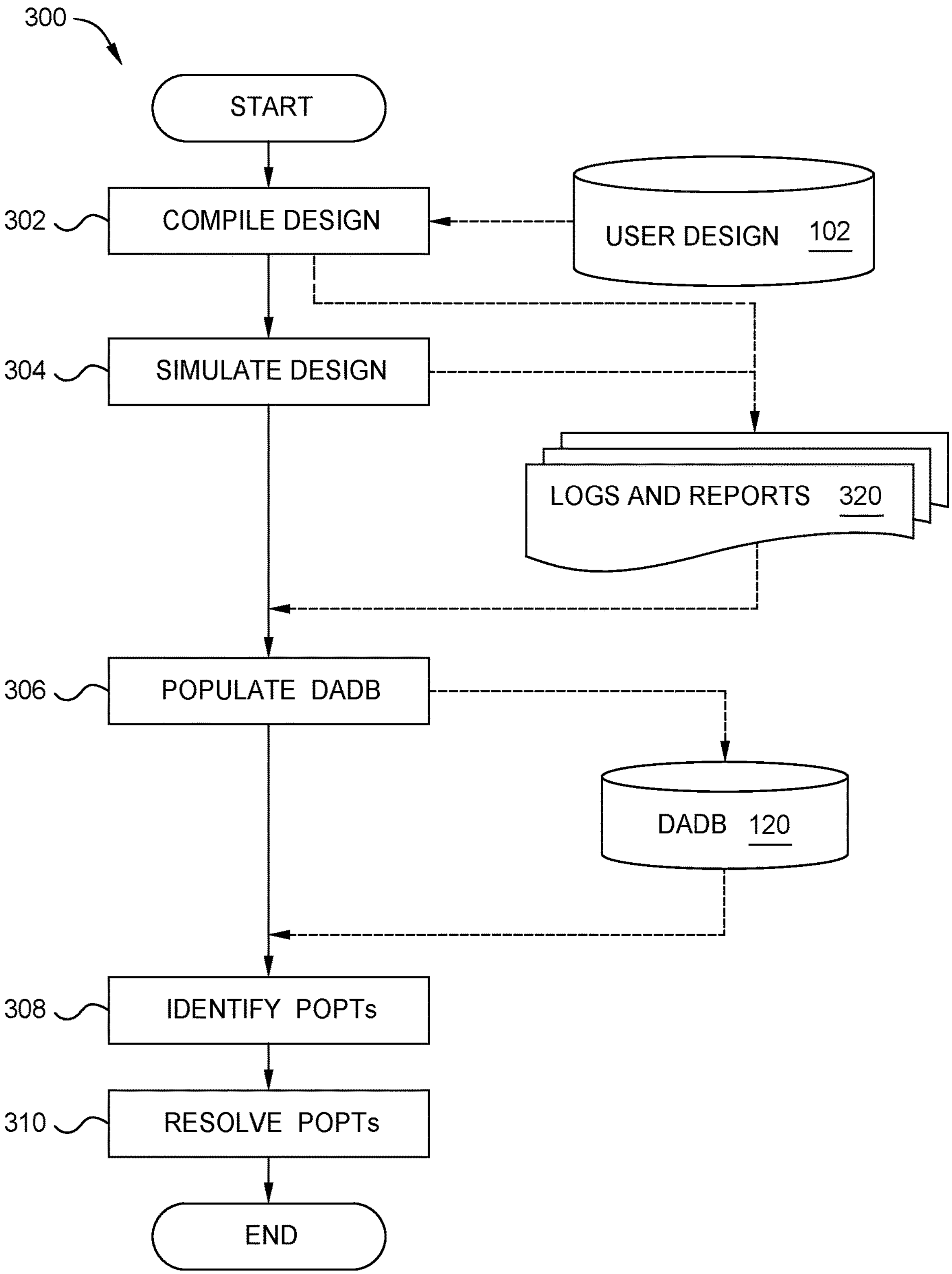
FIG. 3 is a flowchart illustrating automatically identifying POPTs in an IC design, according to one embodiment.

FIG. 3 is a flowchart 300 illustrating automatically identifying POPTs in an IC design, according to one embodiment. In an embodiment, the process of finding potential improvements (e.g., POPTs) in IC designs can be automated using a three-step process that involves populating an electronic Design Activity Database (DADB), analyzing it to identify POPTs, and generating reports. This is merely an example, and any suitable technique can be used. For example, POPTs can be identified directly by analyzing design activity during simulation (e.g., using a simulator) without populating a DADB.

At block 302, a compiler (e.g., an HDL compiler) compiles a user design (e.g., the user design 102 illustrated in FIG. 1). For example, a suitable HDL compiler (e.g., a Verilog or VHDL compiler) can compile the HDL files describing the user design 102 (e.g., Verilog or VHDL files). The compiled files can then be used for design verification (e.g., simulation).

At block 304, a simulator (e.g., the simulator 112 illustrated in FIGS. 1-2) simulates the design (e.g., using the compiled HDL files generated at block 302). Any suitable HDL compiler and simulator can be used. In an embodiment, the simulator generates logs and reports 320 to be used to identify POPTs. For example, as discussed further below with regard to FIG. 4, the simulator can generate numerous logs and reports 320, which can be used to populate a repository (e.g., the DADB 120 illustrated in FIG. 1) and identify POPTs. Alternatively, or in addition, the logs and reports 320 can be generated by a compiler (e.g., when the design is compiled at block 302).

At block 306, a simulation improvement service (e.g., the simulation improvement service 114 illustrated in FIGS. 1-2) populates a DADB (e.g., the DADB 120). In an embodiment, the DADB can be any suitable electronic database or other repository, and contains activity data (e.g., simulation activity data) and other statistics for the design. For example, the simulation data and statistics can be arranged hierarchically in the form of records.

In an embodiment the top-level object in the DADB is a design record that contains global activity data for the design, and the design record includes one or more child scope records. For example, each scope record within the design record can relate to a given HDL scope for the design and can indicate simulation activity data for the scope. Further, each scope record can include one or more child signal records and one or more child process records.

The signal records and process records contain simulation activity data for signals and processes in the design, respectively, as discussed further below with regard to FIG. 5. A signal record may contain several buckets corresponding to activities on a given signal, with each bucket representing a particular type of simulation activity. A process record may indicate how much time was spent executing a given process during simulation, and can include several buckets corresponding to how many times a given process was triggered during simulation, with each bucket representing a signal that the process is sensitive to. Parsing design records, scope records, signal records, and process records is described further below with regard to FIGS. 4 and 5. This is merely one example of a suitable storage scheme for storing data in the DADB, and any suitable storage technique can be used.

In an embodiment, data for populating the DADB (e.g., logs and reports 320) is collected during simulation at block 304. For example, the simulator can identify locations during simulation for data collection, and can establish buckets to collect various types of diagnostics at different stages during simulation. These buckets can include a variety of suitable information, including details of the events on signals and processes during simulation, reports from a profiling tool with details of the time taken by the individual functions during simulation, file name and line number maps, and other statistics from the design. The diagnostics collected may correspond both to simulation activity in the design, and also to other metrics. For example, the diagnostics can correspond to identification of certain constructs in the design, debug capabilities on various elements in the design, diagnostic reports from various transformations, instance tree, etc. Once collected, these data and statistics are used to generate reports, which can be used to populate the DADB.

At block 308, the simulation improvement service analyzes DADB data to identify POPTs. This is discussed further below with regard to FIG. 5. For example, the simulation improvement service can identify signal and process activities during the simulation, and can identify POPTs based on the identified activities. While FIG. 3 illustrates populating a DADB during simulation, and using records in the DADB to identify POPTs, this is merely one example. In an embodiment, the simulation improvement service identifies POPTs using data directly from simulation (e.g., without using a DADB or another repository). Further, in an embodiment, the simulation improvement service is integrated with a simulator and identifies POPTs directly, during simulation.

At block 310 the simulation improvement service resolves POPTs (e.g., one or more of the POPTs identified at block 308). For example, the simulation improvement service can generate reports (e.g., to assist users in improving design simulation using the POPTs) and a summary file. In an embodiment, the summary file identifies the POPTs and the location in the user's design (e.g., in an HDL file) where the design can be improved.

Alternatively, or in addition, the simulation improvement service annotates a user's design directly. The simulation improvement service can, for example, generate a view of the user's design (e.g., a view of the user design 102 that provides additional information about the design without changing the underlying design) describing POPTs, resolutions for POPTs (e.g., potential changes to the design or to simulation or design parameters), or both, and the user can identify the POPTs and resolutions for POPTs from the view. In an embodiment, the simulation improvement service further annotates one or more HDL files directly (e.g., by adding comments) to describe POPTs, resolutions for POPTs, or both, and to assist a user in improving a design.

Figure 4:
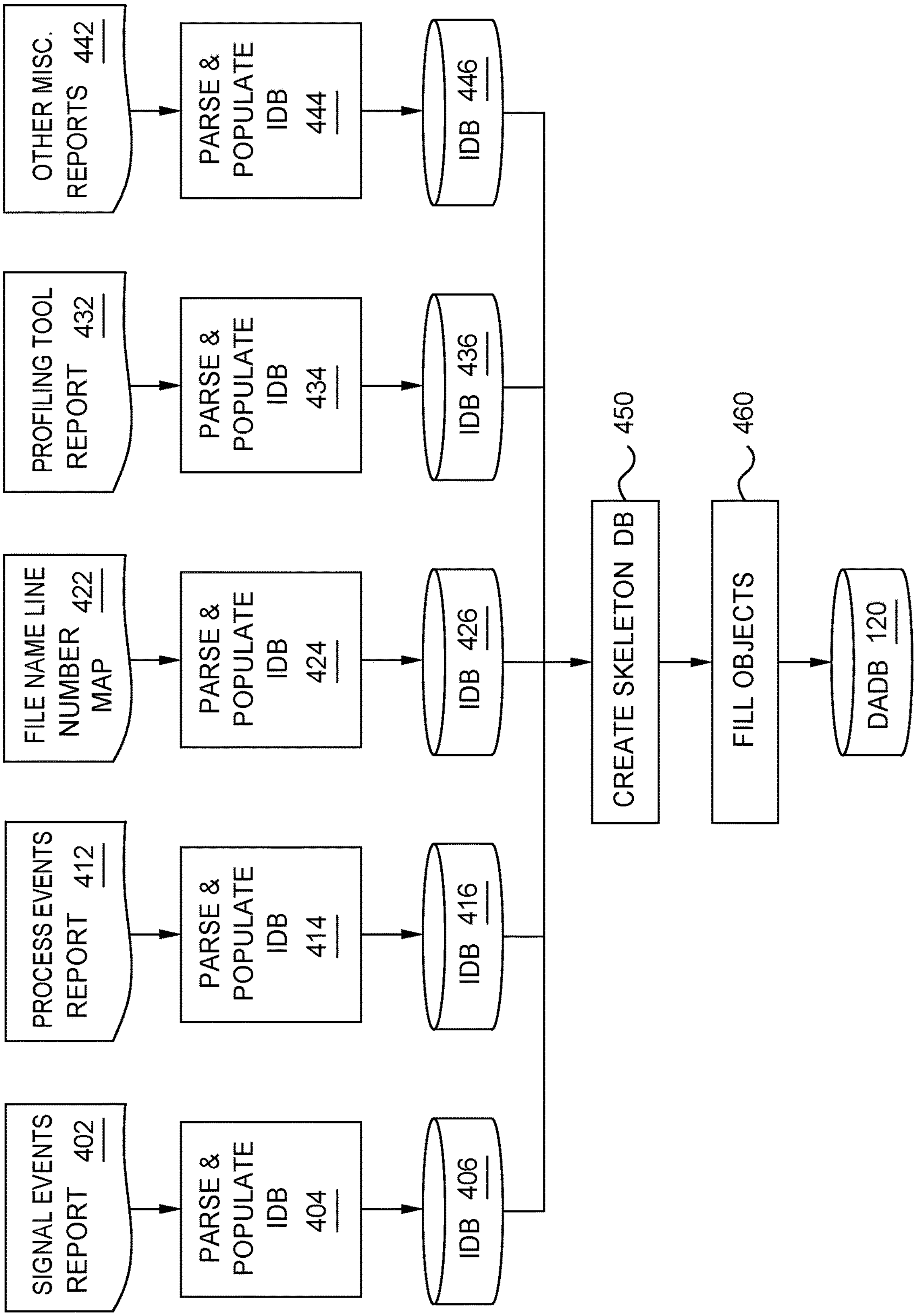
FIG. 4 illustrates parsing reports to populate a database for improving an IC design for simulation, according to one embodiment.

FIG. 4 illustrates parsing reports to populate a database for improving an IC design for simulation, according to one embodiment. As discussed above in relation to FIG. 3, in an embodiment logs and reports 320 are generated during simulation (e.g., at block 304 illustrated in FIG. 3), compilation (e.g., at block 302 illustrated in FIG. 3), or both. For example, a signal events report 402, a process events report 412, a file name line number map 422, a profiling tool report 432, and other miscellaneous reports 442, can be generated. These are merely examples. In an embodiment some, but not all, of these reports are generated. Further, additional reports can be generated.

In an embodiment, the signal events report 402 provides information about operation of signals during a simulation. For example, the signal events report 402 can indicate a number of times a given signal is toggled during simulation. In an embodiment, the signal events report 402 identifies each signal using a suitable identifier (e.g., a key or a unique numbering scheme).

In an embodiment, the process events report 412 provides information about operation of processes during simulation. For example, the process events report 412 can indicate a number of times a given process is triggered during simulation. In an embodiment, the process events report 412 identifies each process using a suitable identifier (e.g., a name or number).

In an embodiment, the file name line number map 422 indicates a correlation between potential POPTs and line numbers in a description of an IC design (e.g., line numbers in an HDL file). For example, the file name line number map 422 can indicate file names and line numbers corresponding to the signals and processes indicated in the signal events report 402 and the process events report 412. As discussed further below, the file name line number map 422 can be used to include POPTs directly in a design file (e.g., in an HDL design file as comments).

In an embodiment, the profiling tool report 432 indicates profile information for the simulation. For example, the profiling tool report 432 can indicate the time spent in various functions during simulation. The profiling tool report 432 can be generated using any suitable profiling tool.

In an embodiment, other miscellaneous reports 442 can also be generated. These can include any suitable information, including information about design constructs, debug capabilities enabled on various elements of the design, diagnostic reports for transformations, instance trees, etc.

In an embodiment, a simulation improvement service (e.g., the simulation improvement service 114 illustrated in FIGS. 1-2) parses the reports 402, 412, 422, 432, and 442 to populate respective Intermediate Databases (IDBs) for each category of data. For example, the simulation improvement service can parse the reports 402, 412, 422, 432, and 442 at blocks 404, 414, 424, 434, and 444 to populate respective IDBs 406, 416, 426, 436, and 446. The simulation improvement service can use any suitable parsing tool or technique (e.g., Lex-Yacc, line-by-line parsing, or any other suitable tool or techniques). In an embodiment, the simulation improvement service can select the parsing tool or technique based on the format of the reports. For example, each report 402, 412, 422, 432, and 442 could be in a different format and use its own parser, or one or more of the reports 402, 412, 422, 432, and 442 could share a parser.

Further, in embodiment, the format of the various IDBs 406, 416, 426, 436, and 446 differs based on the type of data it contains. For example, an IDB corresponding to an instance tree could use a tree representation, while an IDB corresponding to a source location map could use a hash table representation. Each IDB 406, 416, 426, 436, and 446 could use a different format, or one or more of the IDBs 406, 416, 426, 436, and 446 could use the same format.

In an embodiment, at block 450 the simulation improvement service creates a skeleton database to populate the DADB 120 (e.g., the DADB 120 illustrated in FIG. 1 and three). For example, the skeleton database can include hierarchically arranged empty records (e.g., created from an instance tree for the design). In an embodiment, at block 460 the simulation improvement service fills the skeleton database with objects. For example, the simulation improvement service can iterate over all IDBs (e.g., IDBs 406, 416, 426, 436, and 446) to fill details for the skeleton objects. The simulation improvement service considers the DADB 120 fully populated once all IDBs (e.g., IDBs 406, 416, 426, 436, and 446) have been processed.

As discussed above, the simulation improvement service uses the IDBs 406, 416, 426, 436, and 446, and a skeleton database, to populate the DADB 120. This is merely one example. Alternatively, or in addition, the simulation improvement service can populate the DADB 120 without using a skeleton database, or without using IDBs 406, 416, 426, 436, and 446. For example, the simulation improvement service can populate the DADB 120 directly from the IDBs 406, 416, 426, 436, and 446 without creating the skeleton database at block 450, or directly from the reports 402, 412, 422, 432, and 442, without using IDBs 406, 416, 426, 436, and 446.

Figure 5:
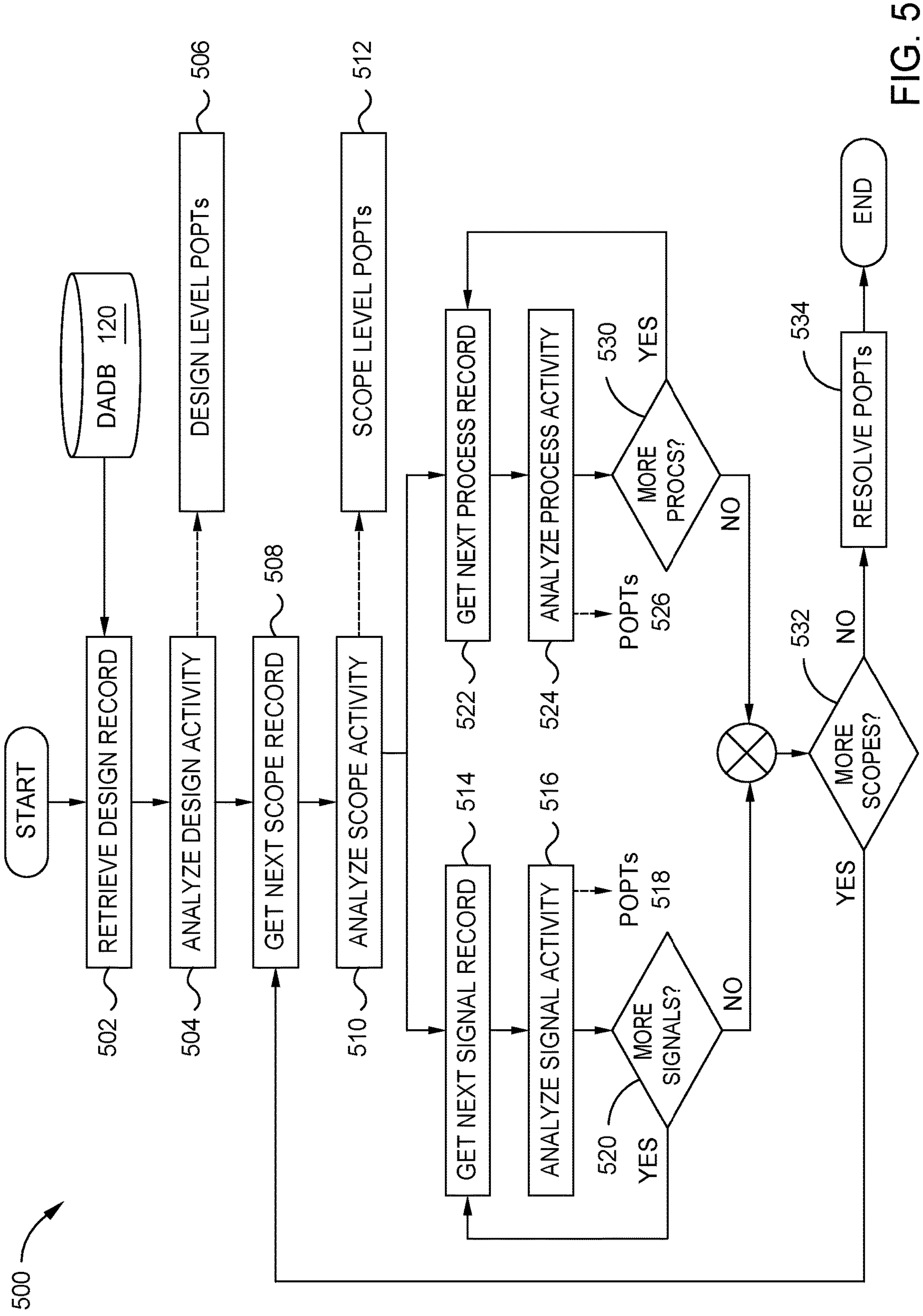
FIG. 5 is a flowchart illustrating identifying POPTs for improving a design for simulation, according to one embodiment.

FIG. 5 is a flowchart 500 illustrating identifying POPTs for improving a design for simulation, according to one embodiment. In an embodiment, at block 502 a simulation improvement service (e.g., the simulation improvement service 114 illustrated in FIGS. 1-2) retrieves a design record (e.g., from a DADB 120). In an embodiment, as discussed above, a design record includes one or more scope records, each of which can include one or more signal records and one or more process records. As discussed below the simulation improvement service can operate on a per-scope, per-signal, and per-process basis, iterating through each respective scope record, signal record, and process record in the retrieved design record. This is merely an example, and a design record can have any suitable format.

At block 504, the simulation improvement service analyzes the design record for global design activity and other statistics to identify design-level POPTs 506. For example, design level POPTs 506 can include, but are not limited to, detecting whether any key optimization for a simulator (e.g., the simulator 112 illustrated in FIG. 2) is turned off at the design level. Design level POPTs 506 can further include identifying excessive or unnecessary debug capabilities or optimizations enabled on the design (e.g., for the simulator) that can have a significant impact on performance. In an embodiment, failing to enable useful optimizations in the simulator, or unnecessarily enabling excessive debug capabilities or computationally intensive simulations, can have a detrimental effect on simulation performance for the design.

At block 534, discussed further below, the simulation improvement service resolves any design level POPTs 506. For example, the simulation improvement service can identify available optimizations for the simulator that have not been enabled, or can identify unnecessary and computationally expensive optimizations that are incorrectly enabled. As another example, the simulation improvement service can identify excessive or unnecessary debug capabilities enabled for simulation of the design. In an embodiment, the simulation improvement service can resolve these design level POPTs 506 by presenting them to a user. For example, as discussed further below, the simulation improvement service can present suitable reports to the user, can annotate the design directly (e.g., adding comments to a header portion of an HDL file representing the design), or can resolve the POPTs using any other suitable technique.

At blocks 508-530, the simulation improvement service iterates over each child scope record in the design record. For example, at block 508 the simulation improvement service retrieves a next scope record (e.g., a next scope record in the design record retrieved at block 502). At block 510, the simulation improvement service analyzes the scope record to identify scope-level POPTs 512. For example, the simulation improvement service can analyze scope activity and other statistics to identify the scope-level POPTs 512. Examples of scope-level POPTs 512 include, but are not limited to, detecting if any key optimization is turned off at a scope level. Further examples of scope-level POPTs 512 include identifying if there are excessive debug capabilities enabled on the scope that can have significant impact on performance. Scope-level POPTs 512 may also highlight interesting scenarios based on activities in the design, which may benefit from a new type of optimization or transformation.

At block 534, discussed further below, the simulation improvement service resolves any scope level POPTs 512. For example, as discussed above in relation to design level POPTs 506, the simulation improvement service can identify available optimizations for the scope during simulation, unnecessary and computationally expensive optimizations that are incorrectly enabled for the scope during simulation, or excessive or unnecessary debug capabilities enabled for the scope during simulation. In an embodiment, the simulation improvement service can resolve these scope level POPTs by presenting suitable reports to the user, annotating the design directly, or using any other suitable technique.

At blocks 514-520, the simulation improvement service iterates over child signal records in the scope record (e.g., the next scope record identified at block 508). At block 514 the simulation improvement service retrieves a next signal record (e.g., a next signal record in the identified scope record). At block 516, the simulation improvement service analyzes signal activity and other statistics to identify signal level POPTs 518. In an embodiment, signal level POPTs 518 include, but are not limited to, a signal type being misidentified.

For example, a signal having activity like a clock, may nonetheless not be identified as a clock during compilation (e.g., during compiling illustrated at block 302 in FIG. 3, above). A signal record for the signal can show that the signal was not identified as a clock in the compiler, but that the signal shows a high event activity (e.g., a signal activity meeting or exceeding a threshold value) during simulation similar to other signals that were identified as clocks by the compiler. This is discussed further with regard to FIG. 6, below.

Identifying mis-identified clock signals is advantageous because clocks are typically the most active signals in a design, and identifying them correctly and handling them appropriately can significantly improve simulation performance. As another example, incorrectly identifying a signal as a clock during compilation, where the signal does not have the activity of a clock, can degrade performance. In an embodiment, this is because special handling of clocks in a design typically assumes that the signal will have very high activity on it. If the activity is not high enough then the overhead of the special treatment could be more than the benefits received, leading to degraded performance. Such signals may also be identified as POPTs.

At block 520, the simulation improvement service analyzes the scope record to determine whether it includes additional signal records. If so, the flow returns to block 514 and the next signal record is retrieved. If not, the flow proceeds to block 532.

Returning to block 510, at block 522-530 the simulation improvement service iterates over the child process records in the scope record. In an embodiment, the simulation improvement service iterates over the signal records (e.g., at blocks 514-520) and the process records (e.g., at blocks 522-530) in parallel. Alternatively, the simulation improvement service iterates over the signal records (e.g., at blocks 514-520) and the process records (e.g., at blocks 522-530) serially.

At block 522, the simulation improvement service parses the scope record to retrieve a next process record (e.g., the next process record in the scope record identified at block 508). At block 524, the simulation improvement service analyzes process activity and other statistics in the process record, to identify process level POPTs 526. In an embodiment, process level POPTs 526 include, but are not limited to, identifying a process that is taking up a significant fraction of the total simulation time, even when it is not getting triggered as much as other high event processes in the design. This is discussed further below with regard to FIG. 6. In an embodiment, this could indicate an inefficiency in the way the process is written in the design, or an inefficiency in the way the process is being handled in the simulator. Both of which, when addressed, would lead to performance improvements.

At block 530 the simulation improvement service parses the scope record to determine whether the scope record includes additional process records. If so, the flow returns to block 522 and the simulation improvement service retrieves the next process record. If not, the flow proceeds to block 532. At block 532, the simulation improvement service parses the design record to determine whether it includes additional scope records. If so, the flow returns to block 508 and the next scope record is retrieved. If not, the flow proceeds to block 534.

At block 534, simulation improvement service resolves POPTs (e.g., the identified POPTs). For example, the simulation improvement service can generate reports from one or more of the POPTs 518 and 526. As discussed above, the reports can include a stand-alone summary report for review by a user, or an annotated design file (e.g., an HDL design file) that notes the POPTs at the relevant line numbers.

In an embodiment, identified POPTs are resolved by presenting them in a way that makes them easy to understand and act upon for users. While they can be presented in the form of reports coming out of the flow (e.g., as discussed above), in some circumstances it can be better to directly annotate the POPTs on the source design files at the right places (e.g., including POPTs in the form of comments). For example, this could make the POPTs easy for users to find through a simple search on design files, and easy to understand and act upon since they'll at the right place in the right context (e.g., at the right line number in the design file). As an extra measure to improve productivity, key details from DADB activity records could also be annotated on the design as comments.

Below are examples illustrating reporting of POPTs in the design using annotations. Example 1 is an example of a process POPT:

Example 1

```
always begin /* EC=29.3M(3.51%) POPT-HIGH_RUNTIME_PROC */
   if (~clk) begin
          ...
   end
   else begin
          ...
   end
end
```

In this example, a POPT is added as a comment: "EC=29.3 M (3.51%) POPT-HIGH_RUNTIME_PROC." This could indicate an event count ("EC") of 29.3 M events, which represents 3.51% of all activity within the design. This is marked as a "HIGH_RUNTIME_PROC" POPT. A user can use this indication to identify the POPT and potentially improve the design for future simulation.

Example 2 is an example of a wire POPT:

Example 2

```
   module some_module; /* EC=142.1M(8.79%) */
      wire sig1; /* EC=102.2M(4.49%) POPT-HIGH_ACTIVITY */
      reg sig2; /* EC=990.1K(0.04%) */
         ...
endmodule
```

A wire "sig1" is marked with a comment indicating a potential "HIGH_ACTIVITY" POPT. The POPT indicates an EC of 102.2 M events which represents 4.49% of all activity within the design. A user can use this indication to identify the POPT and potentially improve the design for future simulation. The examples above are provided in SystemVerilog, but the techniques discussed herein are the solution presented in this invention is language independent and can be used for designs written in any suitable HDL(s).

In an embodiment, activity on the design object(s) for which a POPT is identified may be compared with other similar object(s) in the design to provide an estimate of the performance benefit of the POPT. For example, if a POPT is reported for a process that executes very frequently during simulation because a certain optimization is not active on the process, an estimate of the performance benefit of this POPT may be obtained by comparing it with a similar process in the design for which this optimization is enabled.

In an embodiment, multiple runs of the same design can be compared. For example, using an option or turning on a feature during simulation often leads to changes in simulation performance. If performance degrades, it is typically difficult to analyze what changed in the simulation of the design that is responsible for it. In such scenarios, DADB s can be populated for the two runs, and compared against each other for a smarter comparison which provides useful differences that led to the change in performance of the design between the two runs.

In an embodiment, this can highlight differences between the runs including, but not limited to, a signal that is identified as a clock in one run of the design, while it was not identified as a clock in the other run of the design. Or a process gets triggered more often in one run of the design leading to performance degradation as compared to the other run of the design.

In an embodiment, one or more techniques described herein can be used as a mechanism to prove that the optimizations retain the original semantics. The techniques may offer guidance as to the conditions under which the potential POPTs are valid or invalid, so that the proper analysis can be incorporated into the optimizing compiler. For example, a simulation can be run with selected improvements on or off. Activity reports (e.g., the reports 402, 412, 422, 432, and 442 illustrated in FIG. 4) can be generated in each run, and compared to determine that behavior has (or has not) changed.

In an embodiment, one or more techniques described herein can be used to suggest preferred improvements for the design from a family of known techniques. For example, multiple possible improvement techniques may be available for a design (e.g., lazy evaluation, static assignment, dead code, code motion, loop unrolling, etc.). Not every improvement technique, however, is suitable for every design. One or more techniques described herein can be used to better understand a design and identify suitable improvement techniques.

In an embodiment, one or more techniques described herein can be used for feedback to a synthesis tool. For example, the POPTs identified in the synthesized design can be used to point to improvement opportunities that a synthesis tool, itself, may use to generate a more improved netlist or offer better simulation performance.

Figure 6:
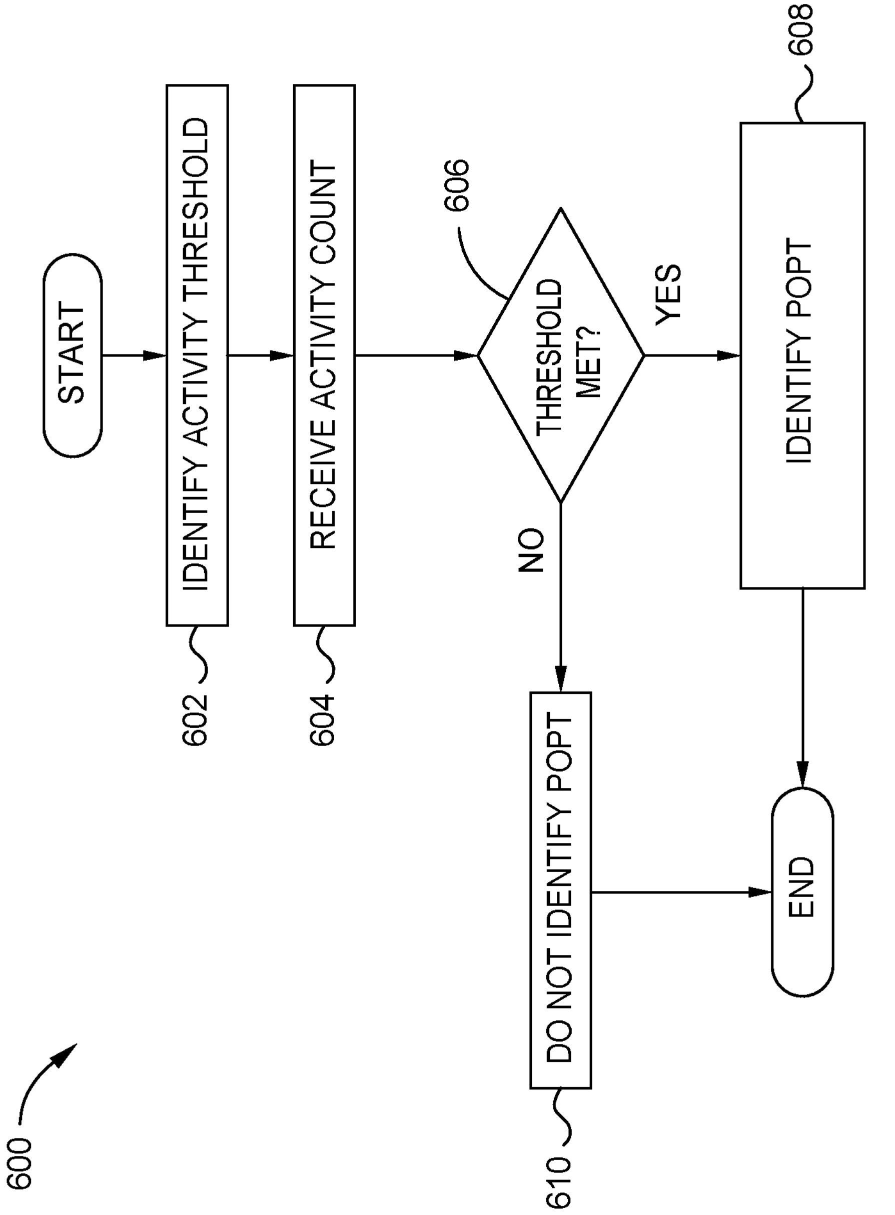
FIG. 6 is a flowchart illustrating identify POPTs using an activity threshold, according to one embodiment.

FIG. 6 is a flowchart 600 illustrating identify POPTs using an activity threshold, according to one embodiment. In an embodiment, FIG. 6 illustrates example techniques suitable to identify POPTs from process and signal activities, as discussed above in relation to block 516 and 524 illustrated in FIG. 5. At block 602, a simulation improvement service (e.g., the simulation improvement service 114 illustrated in FIGS. 1-2) identifies an activity threshold for a given activity (e.g., for a signal activity or a process activity).

In an embodiment, using a correct threshold value can be vital to identifying useful POPTs in the design. Setting thresholds too high could lead to missed opportunities, while setting them too low could lead to low value POPTs getting identified which could lead to reduced productivity. In an embodiment, the simulation improvement service can identify thresholds dynamically. For example, the simulation improvement service can analyze activity in the design using a populated DADB, or using other simulation results, and can set activity thresholds.

These thresholds can be for a particular activity. For example, the simulation improvement service can identify a threshold value for distinguishing a likely clock signal from a likely non-clock signal (e.g., as discussed above in relation to block 516 in FIG. 5), or for identifying a process activity consuming excessive resources during simulation (e.g., as discussed above in relation to block 524 illustrated in FIG. 5). The simulation improvement service can set these thresholds based on identifying the activity levels of active signals in a design. An activity could be considered "high" activity, and thus a likely clock-signal or un-optimized process, if the activity is associated with one of the three most active signals or processes, or if the activity is within a designated percentage of the most active signal or process. In an embodiment, this ensures that opportunities with the most potential to result in a noticeable performance improvement are identified POPTs.

Alternatively, or in addition, the activity threshold is set statically prior to operation of the simulation improvement service (e.g., by a user). The user can set threshold values for various activities using a suitable user interface. For example, a user could set a threshold value for distinguishing a likely clock signal from a likely non-clock signal (e.g., as discussed above in relation to block 516 in FIG. 5), or for identifying a process activity consuming excessive resources during simulation (e.g., as discussed above in relation to block 524 illustrated in FIG. 5).

At block 604, the simulation improvement service receives an activity count (e.g., for a signal or process). At block 606, the simulation improvement service determines whether the threshold (e.g., the threshold identified at block 602) is met by that activity count. For example, the simulation improvement service can determine whether a given signal meets a threshold suggesting that the signal is likely a clock signal, or whether a given process meets a threshold suggesting that the process is likely un-optimized and using excessive resources.

If the simulation improvement service determines that the threshold is met, the flow proceeds to block 608. At block 608, the simulation improvement service identifies a POPT (e.g., for the signal or process associated with the activity count). Returning to block 606, if the simulation improvement service determines that the threshold is not met, the flow proceeds to block 610. At block 610, the simulation improvement service determines that the signal or process associated with the activity count does not have an identified POPT.

In an embodiment, one or more techniques described herein can incorporate machine learning (ML) to allow aggregation of knowledge from multiple designs. In an embodiment, this can be used to infer or identify improvement opportunities for other designs. For example, a supervised ML model could be trained to identify appropriate POPT thresholds for a given design. At block 602, the simulation improvement service could use the ML model to dynamically infer POPT thresholds for the design. As another example, an ML model could be used to identify POPTs across designs (e.g., by aggregating information from multiple designs for a given entity). This can be used to improve thresholds and identify POPTs.

Figure 7:
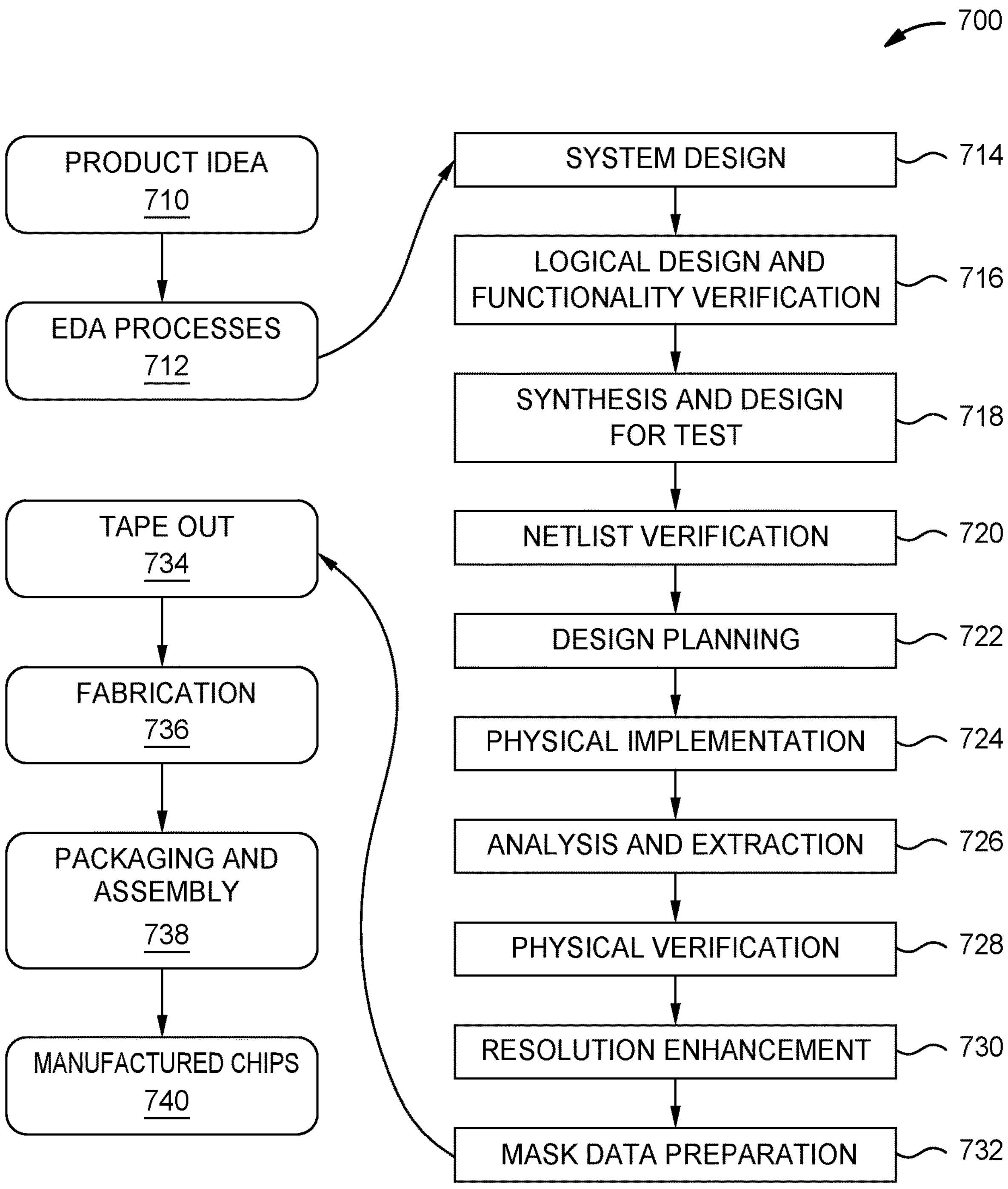
FIG. 7 is a flowchart of various operations in the design and fabrication of an integrated circuit, according to one embodiment.

FIG. 7 is a flowchart of various operations in the design and fabrication of an integrated circuit, according to one embodiment. FIG. 7 illustrates an example set of processes 700 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 710, with the creation of a product idea with information supplied by a designer, information that is transformed to create an integrated circuit that uses a set of EDA processes, at block 712. When the design is finalized, the design is taped-out, at block 734, which is when artwork (e.g., geometric patterns) for the integrated circuit is sent to a fabrication facility to manufacture the mask set, which is then used to manufacture the integrated circuit. After tape-out, at block 736, the integrated circuit is fabricated on a semiconductor die, and at block 738, packaging and assembly processes are performed to produce, at block 740, the finished integrated circuit (oftentimes, also referred to as "chip" or "integrated circuit chip").

Specifications for a circuit or electronic structure may range from low-level transistor material layouts to high-level description languages. A high-level of representation may be used to design circuits and systems, using a hardware description language (HDL) such as VHDL, Verilog, SystemVerilog, SystemC, MyHDL or OpenVera. The HDL description can be transformed to a logic-level RTL description, a gate-level description, a layout-level description, or a mask-level description. Each lower representation level that is a more detailed description adds more useful detail into the design description, such as, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described may be enabled by EDA products (or tools).

During system design, at block 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 718, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 720, the netlist is checked for compliance with timing constraints and for correspondence with the HDL code. During design planning, at block 722, an overall floor plan for the integrated circuit is constructed and analyzed for timing and top-level routing.

During layout or physical implementation, at block 724, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 726, the circuit function is verified at the layout level, which permits refinement of the layout design. During physical verification, at block 728, the layout design is checked to ensure that manufacturing constraints are correct, such as design rule check (DRC) constraints, electrical constraints, lithographic constraints, and that circuitry function matches the HDL design specification. During resolution enhancement, at block 730, the geometry of the layout is transformed to improve how the circuit design is manufactured.

During tape-out, data is created to be used (after lithographic enhancements are applied if appropriate) for production of lithography masks. During mask data preparation, at block 732, the tape-out data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
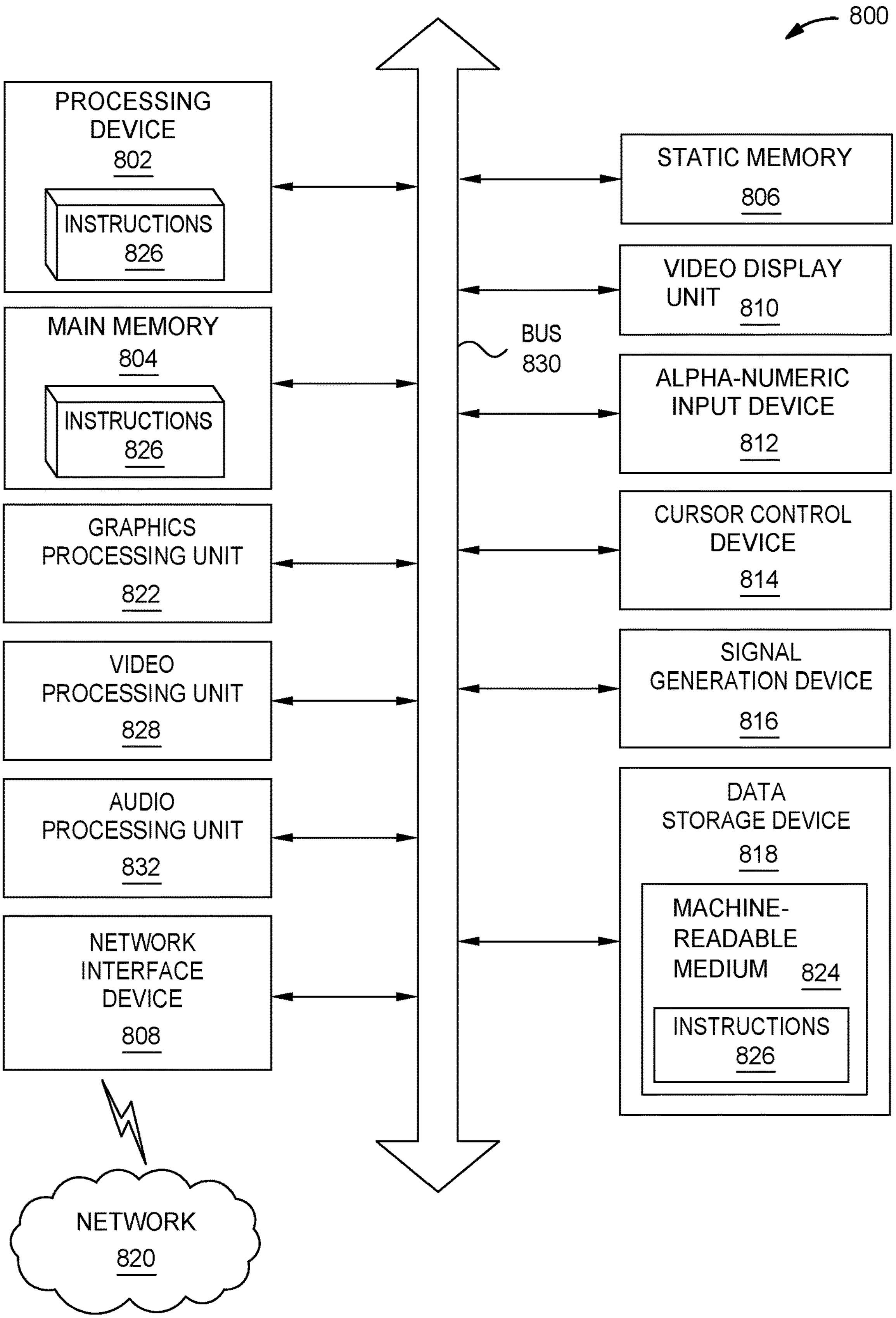
FIG. 8 depicts a diagram of an example computer system in which examples of the present disclosure may operate.

FIG. 8 illustrates an example of a computer system 800 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830. The main memory 804 includes or is a non-transitory computer readable medium. The main memory 804 (e.g., a non-transitory computer readable medium) can store one or more sets of instructions 826, that when executed by the processing device 802, cause the processing device 802 to perform some or all of the operations, steps, methods, and processes described herein.

Processing device 802 represents one or more processors such as a microprocessor, a central processing unit, or the like. More particularly, the processing device 802 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing some or all of the operations, steps, methods, and processes described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (e.g., a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also including machine-readable storage media.

In some implementations, the instructions 826 include instructions to implement functionality described above. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 802 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

determining, by one or more processors, that simulation activity data from results of a circuit simulation of an integrated circuit (IC) design exceeds a threshold; and selecting a modification from multiple modifications, by the one or more processors, based on the simulation activity data exceeding the threshold, wherein the selected modification relates to one or more of improving the IC design and reducing computing resources needed to perform a subsequent circuit simulation of the IC design; and performing an action based on the selected modification, by the one or more processors.

2. The method of claim 1, wherein the selecting the modification comprises one or more of:

selecting a modification for the IC design;

selecting an optimization setting for a circuit simulator to apply to a region of the IC design based on activity data related to the region; and selecting an optimization feature of the circuit simulator to disable for the region of the IC design based on the activity data related to the region.

3. The method of claim 2, wherein the performing the action comprises one or more of:

modifying the IC design based on the selected modification;

modifying a view of the IC design without changing functions of the IC design, based on the selected modification;

adding descriptive comments regarding the selected modification to a portion of a hardware descriptive language (HDL) representation of the IC design that relates to the selected modification;

notifying the circuit simulator of the selected optimization setting of the simulator to apply to the selected region of the IC design;

notifying a circuit simulator of the selected optimization feature of the circuit simulator to disable for the selected region of the IC design;

estimating a measure of improvement for one or more of the IC design and the circuit simulator, based on the selected modification; and identifying a misidentified signal of the IC design based on activity of the signal and an activity threshold.

4. The method of claim 1, further comprising populating intermediate databases based on the simulation activity data;

generating a skeleton database based on the intermediate databases;

generating a design record based on the skeleton database; and extracting the activity data from the design record.

5. The method of claim 1, further comprising identifying a scope record reflecting simulation activity for a hardware descriptive language (HDL) scope relating to the IC design, wherein the selecting the modification comprises selecting the modification based on the scope record.

6. The method of claim 5, wherein the scope record comprises a signal record identifying simulation activity for a signal in the IC design, and wherein the selecting the modification comprises selecting the modification based on the signal record.

7. The method of claim 5, wherein the scope record comprises a process record identifying simulation activity for a process of the circuit design, and wherein the selecting the modification comprises selecting the modification based on the process record.

8. The method of claim 1, wherein the selecting the modification comprises:

identifying a signal of the circuit design that is mislabeled as one of a clock signal and a non-clock based on activity levels of the signal and an activity threshold.

9. The method of claim 1, wherein the simulation activity data comprises one or more of a number of times a process of the circuit design was triggered during the simulation, time spent executing the processes during the simulation, signals related to the process, and a number of times a signal of the circuit design toggled during the simulation.

10. The method of claim 1, wherein the selecting the modification comprises:

selecting a modification that impacts a process activity of the circuit design, based on a process activity meeting a process activity threshold.

11. The method of claim 1, wherein the performing the action comprises:

identifying a line number in a the hardware descriptive language HDL design file of the circuit design corresponding to the selected modification; and inserting a comment into the HDL design file at the line number, wherein the comment describes the selected modification.

12. A non-transitory computer-readable medium containing instructions that, when executed by one or more processors, causes the one or more processors to:

determine that simulation activity data from results of a circuit simulation of an integrated circuit (IC) design exceeds a threshold; and select a modification from multiple modifications based on the simulation activity data exceeding the threshold, wherein the modification relates to one or more of improving the IC design and reducing computing resources needed to perform a subsequent circuit simulation of the IC design; and perform an action based on the selected modification.

13. The non-transitory computer-readable medium of claim 12, wherein the instructions further cause the one or more processors to select one or more of:

a modification for the IC design;

an optimization setting for a circuit simulator to apply to a region of the IC design based on activity data related to the region; and an optimization feature of the circuit simulator to disable for the region of the IC design based on the activity data related to the region.

14. The non-transitory computer-readable medium of claim 13, wherein the instructions further cause the one or more processors to perform one or more of:

modify the IC design based on the selected modification;

modify a view of the IC design without changing functions of the IC design, based on the selected modification;

add descriptive comments regarding the selected modification to a portion of a hardware descriptive language (HDL) representation of the IC design that relates to the selected modification;

notify the circuit simulator of the selected optimization setting;

notify the circuit simulator of the selected optimization feature of the circuit simulator to disable for the selected region of the IC design;

estimate a measure of improvement for one or more of the IC design and the circuit simulator, based on the selected modification; and identify a misidentified signal of the IC design based on activity of the signal and an activity threshold.

15. The non-transitory computer-readable medium of claim 12, wherein the instructions further cause the processor to:

populate intermediate databases based on the simulation activity data, wherein the intermediate databases;

generate a skeleton database based on the intermediate databases;

generating a design record based on the skeleton database; and extract the activity data from the design record.

16. The non-transitory computer-readable medium of claim 15, wherein the instructions further cause the one or more processors to:

identify a signal of the IC design that is mislabeled as one of a clock signal and a non-clock based on activity levels of the signal and an activity threshold.

17. A system, comprising:

a processor; and a memory having instructions stored thereon which, when executed on the processor, cause the processor to:

determine that simulation activity data from results of a circuit simulation of an integrated circuit (IC) design exceeds a threshold;

select a modification from multiple modifications based on the simulation activity data exceeding the threshold, wherein the selected modification relates to one or more of improving the IC design and reducing computing resources needed to perform a subsequent circuit simulation of the IC design; and perform an action based on the selected modification.

18. The system of claim 17, wherein the instructions further cause the processor to select one or more of:

a modification for the IC design;

an optimization setting for a circuit simulator to apply to a region of the IC design based on activity data related to the region; and an optimization feature of the simulator to disable for the region of the IC design based on the activity data related to the region.

19. The system of claim 18, wherein the instructions further cause the processor to perform one or more of:

modify the IC design based on the selected modification;

modify a view of the IC design without changing functions of the IC design, based on the selected modification;

add descriptive comments regarding the selected modification to a portion of a hardware descriptive language (HDL) representation of the IC design that relates to the selected modification;

notify the circuit simulator of the selected optimization feature of the simulator to apply to the selected region of the IC design;

notify the circuit simulator of the selected optimization feature of the circuit simulator to disable for the selected region of the IC design;

estimate a measure of improvement for one or more of the IC design and the circuit simulator, based on the selected modification; and identify a misidentified signal of the IC design based on the signal activity of the signal and a signal toggle threshold.

20. The system of claim 19, wherein the instructions further cause the processor to:

populate intermediate databases based on the simulation activity data;

generate a skeleton database based on the intermediate databases;

generate a design record based on the skeleton database; and extract the activity data from the design record.

* * * * *